(12) United States Patent
Chen

(10) Patent No.: US 11,362,613 B2
(45) Date of Patent: Jun. 14, 2022

(54) MOTOR DRIVING CIRCUIT AND MOTOR DRIVING METHOD

(71) Applicant: ANPEC ELECTRONICS CORPORATION, Hsinchu (TW)

(72) Inventor: Kun-Min Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 17/185,969

(22) Filed: Feb. 26, 2021

(65) Prior Publication Data

US 2022/0131491 A1 Apr. 28, 2022

(30) Foreign Application Priority Data

Oct. 27, 2020 (TW) ................................. 109137224

(51) Int. Cl.
*H02P 6/14* (2016.01)
*H02P 27/08* (2006.01)
*H02P 1/04* (2006.01)
*H02P 23/14* (2006.01)
*G01R 19/165* (2006.01)
*H03K 5/24* (2006.01)
*H02P 1/16* (2006.01)

(52) U.S. Cl.
CPC ........ *H02P 27/08* (2013.01); *G01R 19/16538* (2013.01); *H02P 1/04* (2013.01); *H02P 1/16* (2013.01); *H02P 23/14* (2013.01); *H03K 5/24* (2013.01)

(58) Field of Classification Search
CPC .......... H02P 21/22; H02P 21/14; H02P 27/08; H02P 27/06; H02P 6/28; H02P 29/032; H02P 1/04; H02P 23/14; G01R 19/6538; H03K 5/24
See application file for complete search history.

(56) References Cited

FOREIGN PATENT DOCUMENTS

JP 2014017924 A * 1/2014

* cited by examiner

*Primary Examiner* — Karen Masih
(74) *Attorney, Agent, or Firm* — Li & Cai Intellectual Property Office

(57) ABSTRACT

A motor driving circuit and a motor driving method are provided. The motor driving circuit is used to drive the motor and includes an inverter circuit, a control circuit, a current-limiting circuit, a start circuit and a transient circuit. The control circuit controls the inverter circuit to drive the motor with a motor control current according to a set current limit value indicated by a current-limiting signal, and outputs a steady state ready signal in response to the motor reaching a steady state. The current-limiting circuit generates the current-limiting signal according to a start state signal, or generates the current-limiting signal according to a transient signal. The start circuit outputs the start state signal when the motor starts. The transient circuit detects whether the motor is in a transient state, and outputs the transient signal in response to the motor being in a transient state.

12 Claims, 3 Drawing Sheets

MOTOR DRIVING CIRCUIT AND MOTOR DRIVING METHOD

CROSS-REFERENCE TO RELATED PATENT APPLICATION

This application claims the benefit of priority to Taiwan Patent Application No. 109137224, filed on Oct. 27, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a motor driving circuit and a motor driving method, and more particularly to a motor driving circuit and a motor driving method capable of stabilizing control current of a motor.

BACKGROUND OF THE DISCLOSURE

In existing motor products, due to requirements for peak values and smoothness of a power supply current, a change rate of a soft start of the motor or a change rate of a duty cycle are usually adjusted.

However, adjusting the change rate of the soft start or the change rate of the duty cycle of the motor will slow down the start-up speed of the motor and prolong the time that the motor stays in a transient state, which may cause peak currents, or require a user to make a decision on the transient changes of the motor, which may cause inconvenience in production.

Therefore, how a motor current can be stabilized according to the start state and the transient state of the motor has become one of important issues in the art.

SUMMARY OF THE DISCLOSURE

In response to the above-referenced technical inadequacies, the present disclosure provides a motor driving circuit and a motor driving method that can stabilize a control current of a motor.

In one aspect, the present disclosure provides a motor driving circuit for driving a motor, the motor driving circuit includes an inverter circuit, a control circuit, a current-limiting circuit, a start circuit and a transient circuit. The inverter circuit is connected to the motor. The control circuit is configured to receive a current-limiting signal and a pulse width modulation (PWM) signal, control the inverter circuit to drive the motor with a motor control current according to a set current limit value indicated by the current-limiting signal and the PWM signal, and output a steady state ready signal when the motor reaches a steady state. The current limiting circuit is configured to receive the motor control current, and generate the current-limiting signal according to a start state signal, or generate the current-limiting signal according to a transient signal. The start circuit is configured to output the start state signal when the motor starts. The set current limit value indicated by the current-limiting signal generated by the current-limiting circuit according to the start state signal is a start current limit value. The transient circuit is configured to detect whether the motor is in a transient state. In response to the motor being in the transient state, the transient circuit outputs the transient signal, and the set current limit value indicated by the current-limiting signal that is generated by the current-limiting circuit according to the transient signal is a transient current limit value. The start circuit is configured to stop outputting the start state signal in response to receiving the steady state ready signal, and the transient circuit is configured to stop outputting the transient signal in response to receiving the steady state ready signal. The current-limiting circuit is further configured to generate the current-limiting signal according to the steady state ready signal, and the set current limit value indicated by the current-limiting signal is a steady state current limit value. The steady state current limit value is greater than the start current limit value and the transient current limit value.

In some embodiments, the transient circuit is further configured to determine whether the motor is in the transient state according to a common voltage provided by a common voltage source, a rotational speed signal provided by a rotational speed detection unit, and the PWM signal.

In some embodiments, in response to a change rate of the common voltage exceeding a predetermined voltage change rate, the transient circuit is configured to determine that the motor is in the transient state and output the transient signal.

In some embodiments, in response to a change rate of a motor rotational speed indicated by the rotational speed signal exceeding a predetermined rotational speed change rate, the transient circuit is configured to determine that the motor is in the transient state and output the transient signal.

In some embodiments, in response to a change rate of a duty cycle indicated by the PWM signal exceeding a predetermined duty cycle change rate, the transient circuit is configured to determine that the motor is in the transient state and output the transient signal.

In some embodiments, the current-limiting circuit includes a reference voltage generating circuit and a current-limiting comparison unit. The reference voltage generating circuit is configured to generate a reference voltage having a starting reference voltage value, a transient reference voltage value or a steady state reference voltage in response to receiving the start state signal, the transient signal or the steady state ready signal. The current-limiting comparison unit is configured to compare the reference voltage with a motor driving current from the motor, and output the current-limiting signal corresponding to a comparison result.

In another aspect, the present disclosure provides a motor driving method for driving a motor, the motor driving method includes: configuring a control circuit to receive a current-limiting signal and a pulse width modulation (PWM) signal, control the inverter circuit to drive the motor with a motor control current according to a set current limit value indicated by the current-limiting signal and the PWM signal, and output a steady state ready signal when the motor reaches a steady state; configuring a current limiting circuit to receive the motor control current, and generate the current-limiting signal according to a start state signal, or generate the current-limiting signal according to a transient signal; configuring a start circuit to output the start state signal when the motor starts, in which the set current limit value indicated by the current-limiting signal that is generated by the current-limiting circuit according to the start state signal is a start current limit value; configuring a transient circuit to detect whether the motor is in a transient state; configuring the transient circuit to, in response to the motor being in the transient state, output the transient signal, in which the set current limit value indicated by the current-limiting signal that is generated by the current-limiting circuit according to the transient signal is a transient current limit value; configuring the start circuit to, in response to receiving the steady state ready signal, stop outputting the start state signal; configuring the transient circuit to stop outputting the transient signal in response to receiving the steady state ready signal; and configuring the current-limiting circuit to generate the current-limiting signal according to the steady state ready signal, in which the set current limit value indicated by the current-limiting signal is a steady state current limit value, and the steady state current limit value is greater than the start current limit value and the transient current limit value.

Therefore, the motor driving circuit and the motor driving method provided by the present disclosure can additionally provide a corresponding starting current limit value or a corresponding transient current limit value during a starting process or transient process of the motor, and there is no need to take into account product requirements for peak values and smoothness of the power supply current by adjusting a change rate of a soft-start or a change speed of the duty cycle.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
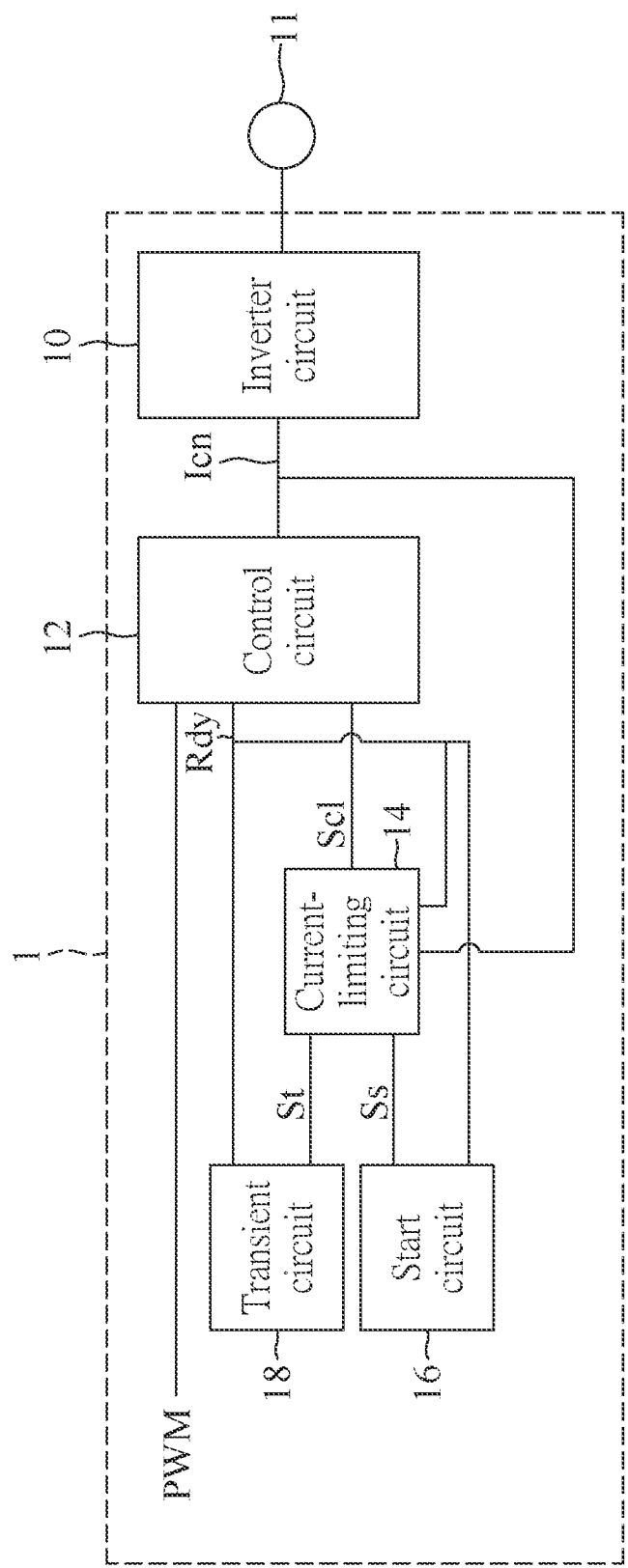
FIG. 1 is a functional block diagram of a motor driving circuit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

FIG. 1 is a functional block diagram of a motor driving circuit according to an embodiment of the present disclosure. Reference is made to FIG. 1, in which the embodiment of the present disclosure provides a motor driving circuit 1 for driving a motor 11 and includes an inverter circuit 10, a control circuit 12, a current-limiting circuit 14, a start circuit 16, and a transient circuit 18.

The inverter circuit 10 is connected to the motor 11. The inverter circuit 10 is used to drive the motor 11 to be rotated. In this embodiment, the inverter circuit 10 can be configured as a half-bridge inverter, a full-bridge inverter, or a three-phase bridge inverter.

The control circuit 12 is connected to the inverter circuit 10, the current-limiting circuit 14, the start circuit 16, and the transient circuit 18, and the control circuit 12 is configured to receive a current-limiting signal Scl and a pulse width modulation signal PWM (referred to as the PWM signal hereinafter), control the inverter circuit 10 to drive the motor 11 with a motor control current Icn according to a set current limit value indicated by the current-limiting signal Scl and the PWM signal, and output a steady state ready signal Rdy when the motor 11 reaches a steady state.

The current-limiting circuit 14 is configured to generate a current-limiting signal S1 according to the start state signal Ss, or to generate the current-limiting signal S1 according to a transient signal St.

In detail, the start circuit 16 is configured to output the start state signal Ss when the motor 11 is started. For example, the start circuit 16 can detect an operating state of the motor 11, for example, when the motor 11 starts to rotate from a standstill, the start circuit 16 determines that the motor 11 is about to start, and outputs the start state signal Ss. The current-limiting circuit 14 generates the current-limiting signal Scl according to the start state signal Ss, and the set current-limiting value indicated by the current-limiting signal Scl generated at this time is a start current-limiting value.

The transient circuit 18 is configured to detect whether the motor 11 is in a transient state, and in response to the motor 11 being in the transient state, the transient circuit 18 outputs the transient signal St.

Figure 2:
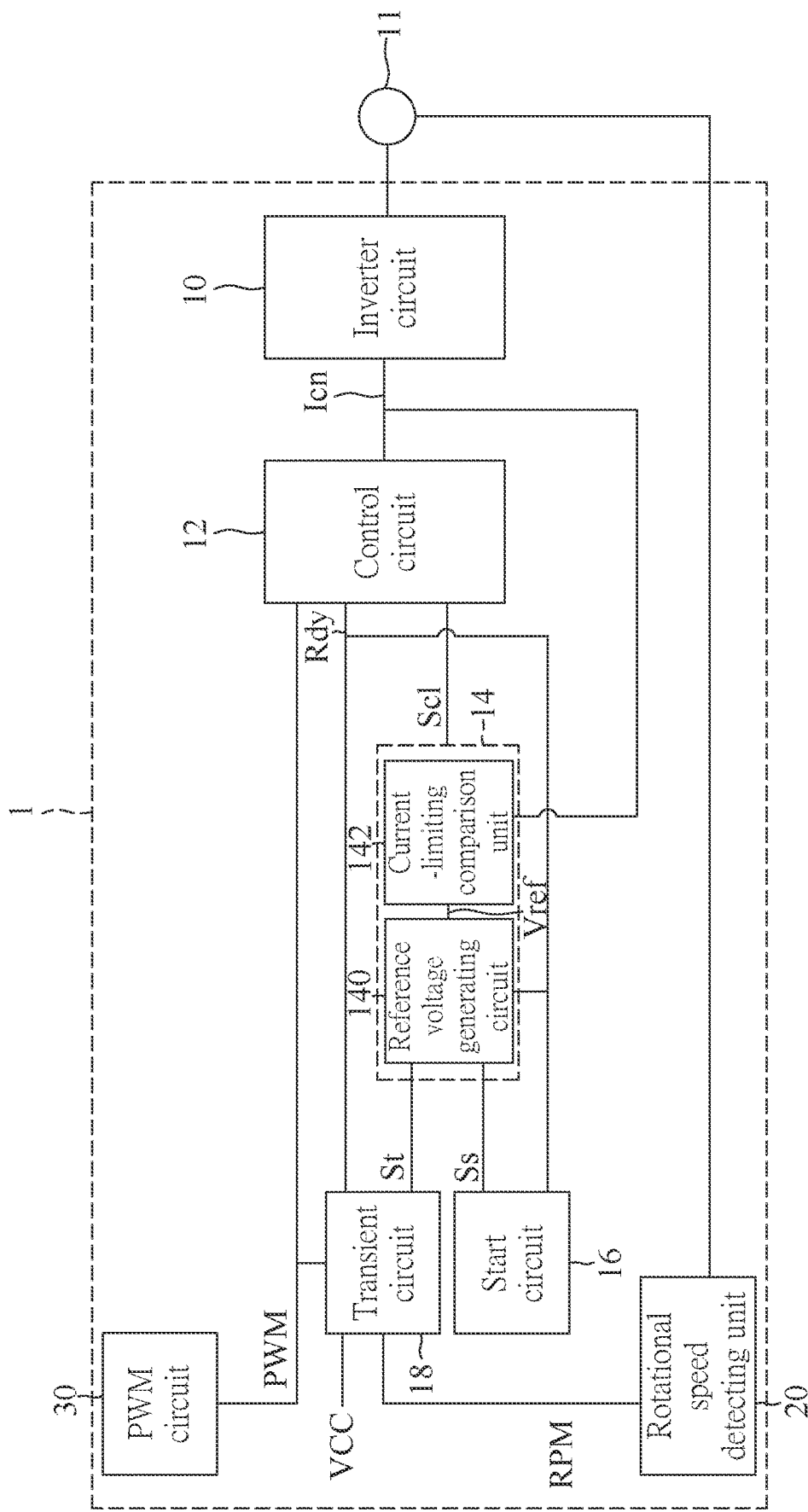
FIG. 2 is another functional block diagram of the motor driving circuit according to the embodiment of the present disclosure.

Reference can be further made to FIG. 2, which is another functional block diagram of the motor driving circuit according to the embodiment of the present disclosure. In the embodiment of FIG. 2, the transient circuit 18 can further receive a common voltage VCC provided by a common voltage source, a rotational speed signal RPM provided by a rotational speed detecting unit 20, and the PWM signal generated by a PWM circuit 30.

The transient circuit 18 can determine whether the motor 11 is in the transient state based on the common voltage VCC, the rotational speed signal RPM, and the PWM signal.

For example, in some embodiments, in response to a change rate of the common voltage VCC exceeding a predetermined voltage change rate, the transient circuit 18 then determines that the motor is in the transient state and outputs the transient signal St.

In another embodiment, when a change rate of the motor rotational speed indicated by the rotational speed signal RPM exceeds a predetermined rotational speed change rate (for example, within a fixed period of time, a change amount in the motor rotation speed or a difference between a target rotational speed and a current motor rotational speed), which may represent that a foreign object is suddenly caught in the motor 11 during stable operation, thus causing the rotational speed to change significantly. Therefore, the transient circuit 18 can determine that the motor 11 is in the transient state and output the transient signal St.

In some embodiments, in response to a change rate of a duty cycle indicated by the PWM signal exceeding a predetermined duty cycle change rate, the transient circuit 18 can also determine that the motor 11 is in the transient state and output the transient signal St. In response to the transient circuit outputting the transient signal St, the set current limit value indicated by the current-limiting signal Scl generated by the current-limiting circuit 14 according to the transient signal St can be a transient current limit value.

In addition, the control circuit 12 can respectively transmit the steady state ready signal Rdy to the current-limiting circuit 14, the start circuit 16 and the transient circuit 18, respectively. The start circuit 16 stops outputting the start state signal Ss in response to receiving the steady state ready signal Rdy, and the transient circuit 18 also stops outputting the transient signal St in response to receiving the steady state ready signal Rdy.

On the other hand, the current-limiting circuit 14 further generates the current-limiting signal Scl according to the steady state ready signal Rdy, and the set current-limiting value indicated by the current-limiting signal Scl generated at this time is a steady state current-limiting value.

Reference can be further made to FIG. 2, in some embodiments, the current-limiting circuit 14 can include a reference voltage generating circuit 140 and a current-limiting comparison unit 142.

The reference voltage generating circuit 140 generates a reference voltage Vref having a starting reference voltage value, a transient reference voltage value or a steady state reference voltage in response to receiving the start state signal Ss, the transient signal St or the steady state ready signal Rdy.

The current-limiting comparison unit 142 is configured to compare the reference voltage Vref with the motor driving current Icn from the motor 11, and output the current-limiting signal Scl corresponding to a comparison result.

It should be noted that the steady state current limit value is greater than the start current limit value and the transient current limit value. In other words, in the start state and the transient state, it is generally undesirable for the motor 11 to bear an excessive motor control current Icn; therefore, the motor control current Icn is limited to a small range. However, the motor 11 can withstand a larger motor control current Icn in the steady state, so that a larger range can be provided.

Therefore, the motor driving circuit 1 can additionally provide a corresponding starting current limit value or a corresponding transient current limit value during a starting process or transient process of the motor 11, and there is no need to take into account product requirements for peak values and smoothness of the power supply current by adjusting a change rate of a soft-start or a change speed of the duty cycle.

Figure 3:
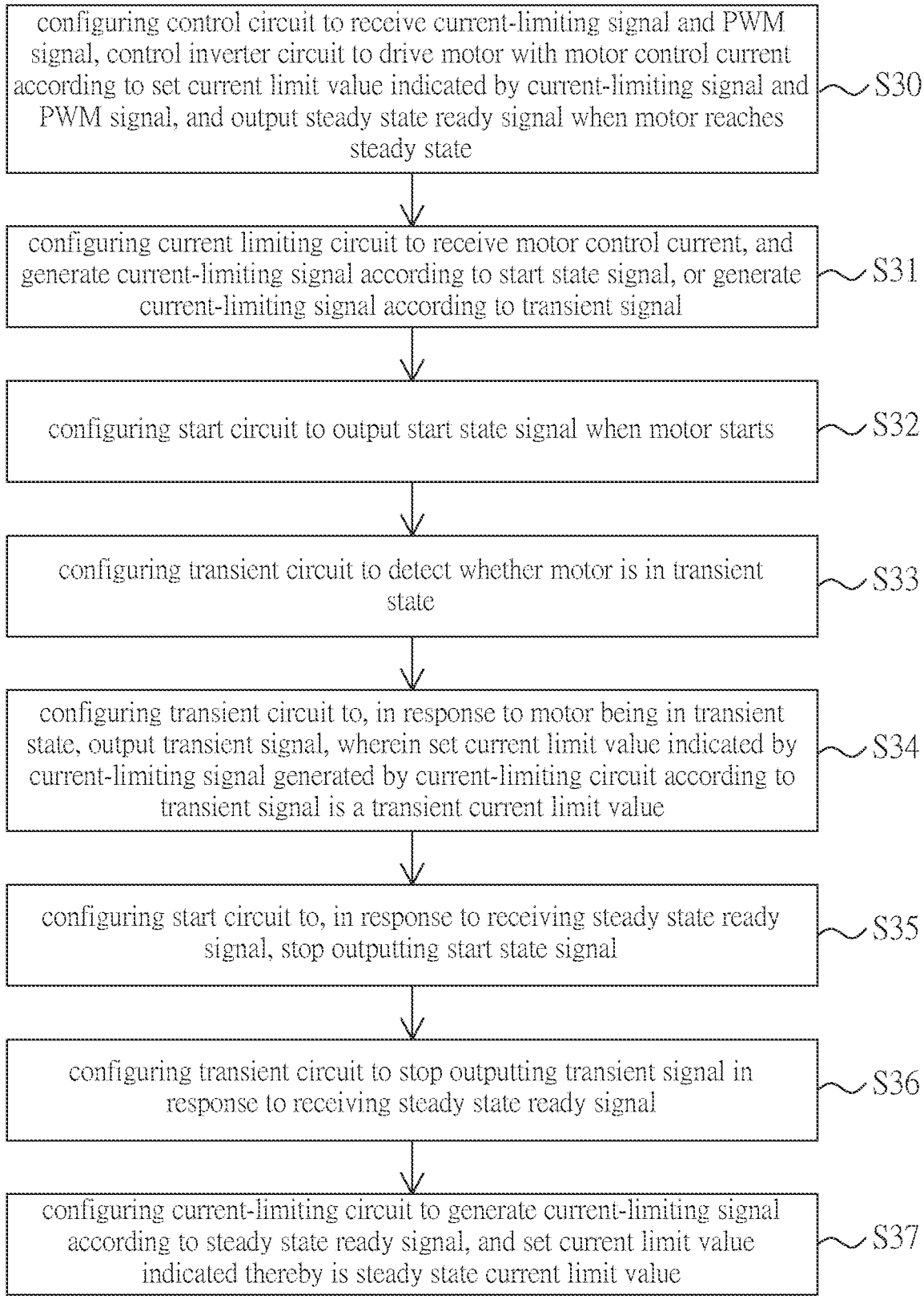
FIG. 3 is a flowchart of a motor driving method according to an embodiment of the present disclosure.

FIG. 3 is a flowchart of a motor driving method according to an embodiment of the present disclosure.

Referring to FIG. 3, an embodiment of the present disclosure provides a motor driving method, which is applicable to the motor driving circuit 1 of the foregoing embodiment and can be used to drive the motor 11. The motor driving method can include the following steps:

Step S30: configuring the control circuit to receive the current-limiting signal and the PWM signal, control the inverter circuit to drive the motor with the motor control current according to the set current limit value indicated by the current-limiting signal and the PWM signal, and output the steady state ready signal when the motor reaches the steady state.

Step S31: configuring the current limiting circuit to receive the motor control current, and generate the current-limiting signal according to a start state signal, or generate the current-limiting signal according to the transient signal.

Step S32: configuring the start circuit to output the start state signal when the motor starts. The set current limit value indicated by the current-limiting signal that is generated by the current-limiting circuit according to the start state signal is a start current limit value.

Step S33: configuring a transient circuit to detect whether the motor is in a transient state.

Step S34: configuring the transient circuit to, in response to the motor being in the transient state, output the transient signal, and the set current limit value indicated by the current-limiting signal that is generated by the current-limiting circuit according to the transient signal is a transient current limit value.

Step S35: configuring the start circuit to, in response to receiving the steady state ready signal, stop outputting the start state signal.

Step S36: configuring the transient circuit to stop outputting the transient signal, in response to receiving the steady state ready signal.

Step S37: configuring the current-limiting circuit to generate the current-limiting signal according to the steady state ready signal, in which the set current limit value indicated thereby is a steady state current limit value. The steady state current limit value is greater than the start current limit value and the transient current limit value.

In conclusion, the motor driving circuit and the motor driving method provided by the present disclosure can additionally provide a corresponding starting current limit value or a corresponding transient current limit value during a starting process or transient process of the motor, and there is no need to take into account product requirements for peak values and smoothness of the power supply current by adjusting a change rate of a soft-start or a change speed of the duty cycle.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A motor driving circuit for driving a motor, comprising:
an inverter circuit connected to the motor;
a control circuit configured to receive a current-limiting signal and a pulse width modulation (PWM) signal, control the inverter circuit to drive the motor with a motor control current according to a set current limit value indicated by the current-limiting signal and the PWM signal, and output a steady state ready signal when the motor reaches a steady state;
a current limiting circuit configured to receive the motor control current, and generate the current-limiting signal according to a start state signal, or generate the current-limiting signal according to a transient signal;
a start circuit configured to output the start state signal when the motor starts, wherein the set current limit value indicated by the current-limiting signal that is generated by the current-limiting circuit according to the start state signal is a start current limit value; and
a transient circuit configured to detect whether the motor is in a transient state, wherein, in response to the motor being in the transient state, the transient circuit outputs the transient signal, and the set current limit value indicated by the current-limiting signal that is generated by the current-limiting circuit according to the transient signal is a transient current limit value,
wherein the start circuit is configured to stop outputting the start state signal in response to receiving the steady state ready signal, and the transient circuit is configured to stop outputting the transient signal in response to receiving the steady state ready signal;
wherein the current-limiting circuit is further configured to generate the current-limiting signal according to the steady state ready signal, and the set current limit value indicated by the current-limiting signal is a steady state current limit value; and
wherein the steady state current limit value is greater than the start current limit value and the transient current limit value.

2. The motor driving circuit according to claim 1, wherein the transient circuit is further configured to determine whether the motor is in the transient state according to a common voltage provided by a common voltage source, a rotational speed signal provided by a rotational speed detection unit, and the PWM signal.

3. The motor driving circuit according to claim 2, wherein, in response to a change rate of the common voltage exceeding a predetermined voltage change rate, the transient circuit is configured to determine that the motor is in the transient state and output the transient signal.

4. The motor driving circuit according to claim 2, wherein, in response to a change rate of a motor rotational speed indicated by the rotational speed signal exceeding a predetermined rotational speed change rate, the transient circuit is configured to determine that the motor is in the transient state and output the transient signal.

5. The motor driving circuit of claim 2, wherein, in response to a change rate of a duty cycle indicated by the PWM signal exceeding a predetermined duty cycle change rate, the transient circuit is configured to determine that the motor is in the transient state and output the transient signal.

6. The motor driving circuit according to claim 2, wherein the current-limiting circuit includes:
a reference voltage generating circuit configured to generate a reference voltage having a starting reference voltage value, a transient reference voltage value or a steady state reference voltage in response to receiving the start state signal, the transient signal or the steady state ready signal; and
a current-limiting comparison unit configured to compare the reference voltage with a motor driving current from the motor, and output the current-limiting signal corresponding to a comparison result.

7. A motor driving method for driving a motor, comprising:
configuring a control circuit to receive a current-limiting signal and a pulse width modulation (PWM) signal, control the inverter circuit to drive the motor with a motor control current according to a set current limit value indicated by the current-limiting signal and the PWM signal, and output a steady state ready signal when the motor reaches a steady state;
configuring a current limiting circuit to receive the motor control current, and generate the current-limiting signal according to a start state signal, or generate the current-limiting signal according to a transient signal;
configuring a start circuit to output the start state signal when the motor starts, wherein the set current limit value indicated by the current-limiting signal that is generated by the current-limiting circuit according to the start state signal is a start current limit value;
configuring a transient circuit to detect whether the motor is in a transient state;
configuring the transient circuit to, in response to the motor being in the transient state, output the transient signal, wherein the set current limit value indicated by the current-limiting signal that is generated by the current-limiting circuit according to the transient signal is a transient current limit value;
configuring the start circuit to, in response to receiving the steady state ready signal, stop outputting the start state signal;
configuring the transient circuit to stop outputting the transient signal in response to receiving the steady state ready signal; and
configuring the current-limiting circuit to generate the current-limiting signal according to the steady state ready signal, wherein the set current limit value indicated by the current-limiting signal is a steady state current limit value,
wherein the steady state current limit value is greater than the start current limit value and the transient current limit value.

8. The motor driving method according to claim 7, further comprising configuring the transient circuit to determine whether the motor is in the transient state according to a common voltage provided by a common voltage source, a rotational speed signal provided by a rotational speed detection unit, and the PWM signal.

9. The motor driving method according to claim 8, further comprising configuring the transient circuit to, in response to a change rate of the common voltage exceeding a predetermined voltage change rate, determine that the motor is in the transient state and output the transient signal.

10. The motor driving method according to claim 8, further comprising configuring the transient circuit to, in response to a change rate of a motor rotational speed indicated by the rotational speed signal exceeding a predetermined rotational speed change rate, determine that the motor is in the transient state and output the transient signal.

11. The motor driving method of claim 8, further comprising configuring the transient circuit to, in response to a change rate of a duty cycle indicated by the PWM signal exceeding a predetermined duty cycle change rate, determine that the motor is in the transient state and output the transient signal.

12. The motor driving method according to claim 8, further comprising:
 configuring a reference voltage generating circuit to generate a reference voltage having a starting reference voltage value, a transient reference voltage value or a steady state reference voltage in response to receiving the start state signal, the transient signal or the steady state ready signal; and
 configuring a current-limiting comparison unit to compare the reference voltage with a motor driving current from the motor, and output the current-limiting signal corresponding to a comparison result.

\* \* \* \* \*